(12) United States Patent
Yan et al.

(10) Patent No.: US 11,259,399 B2
(45) Date of Patent: Feb. 22, 2022

(54) SOCKET WITH THERMAL CONDUCTOR

(71) Applicant: Intel Corporation, Santa Clara, CA (US)

(72) Inventors: Hongfei Yan, Mesa, AZ (US); Yuan-Liang Li, Taipei (TW); Leo Liu, Taipei (TW); Chunlei Guo, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 846 days.

(21) Appl. No.: 15/901,660

(22) Filed: Feb. 21, 2018

(65) Prior Publication Data

US 2019/0045619 A1 Feb. 7, 2019

(51) Int. Cl.
| | |
|---|---|
| *H01L 23/367* | (2006.01) |
| *H05K 1/02* | (2006.01) |
| *H01L 23/498* | (2006.01) |
| *H01L 23/42* | (2006.01) |
| *H01L 23/373* | (2006.01) |
| *G01R 1/04* | (2006.01) |

(52) U.S. Cl.
CPC ......... *H05K 1/0206* (2013.01); *G01R 1/0483* (2013.01); *H01L 23/367* (2013.01); *H01L 23/3675* (2013.01); *H01L 23/3677* (2013.01); *H01L 23/3736* (2013.01); *H01L 23/42* (2013.01); *H01L 23/49833* (2013.01); *H01L 2224/16225* (2013.01); *H01L 2224/32225* (2013.01); *H01L 2224/73204* (2013.01); *H01L 2224/73253* (2013.01); *H05K 2201/10325* (2013.01); *H05K 2201/2009* (2013.01)

(58) Field of Classification Search
CPC ....... H05K 1/0206; H05K 2201/10325; H05K 2201/2009; H05K 3/325; H05K 3/301; H01L 23/3677; H01L 23/42; H01L 23/367; H01L 23/3736; H01L 23/3675; H01L 23/49833; H01L 2224/73253; H01L 2224/32225; H01L 2224/16225; H01L 2224/73204; H01L 2924/00; G01R 1/0483

See application file for complete search history.

(56) References Cited

U.S. PATENT DOCUMENTS

| | | | |
|---|---|---|---|
| 2015/0255441 A1* | 9/2015 | Lamorey | H01L 23/562 257/704 |
| 2016/0247781 A1* | 8/2016 | Sung | H01L 24/19 |
| 2019/0116670 A1* | 4/2019 | Anderson | H05K 1/021 |

* cited by examiner

*Primary Examiner* — Thanh T Nguyen
(74) *Attorney, Agent, or Firm* — Schwabe, Williamson & Wyatt, P.C.

(57) ABSTRACT

Embodiments herein may include apparatuses, systems, and processes related to a socket with a first side to receive a package substrate and a second side coupled with a printed circuit board (PCB), which may be a mother board, where the socket has a cavity into which a thermal conductor is inserted to conduct heat from the package substrate to the PCB. In embodiments, the PCB may contain thermal vias to conduct heat from one side of the PCB to the other side. Other embodiments may be described and/or claimed.

18 Claims, 7 Drawing Sheets

SOCKET WITH THERMAL CONDUCTOR

FIELD

Embodiments of the present disclosure generally relate to the field of integrated circuit (IC) package assemblies, and in particular sockets able to receive substrate packages.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

The increase of computing power of processor dies attached to substrate packages have increased thermal dissipation requirements for the proper operation of the dies.

DETAILED DESCRIPTION

Figure 1:
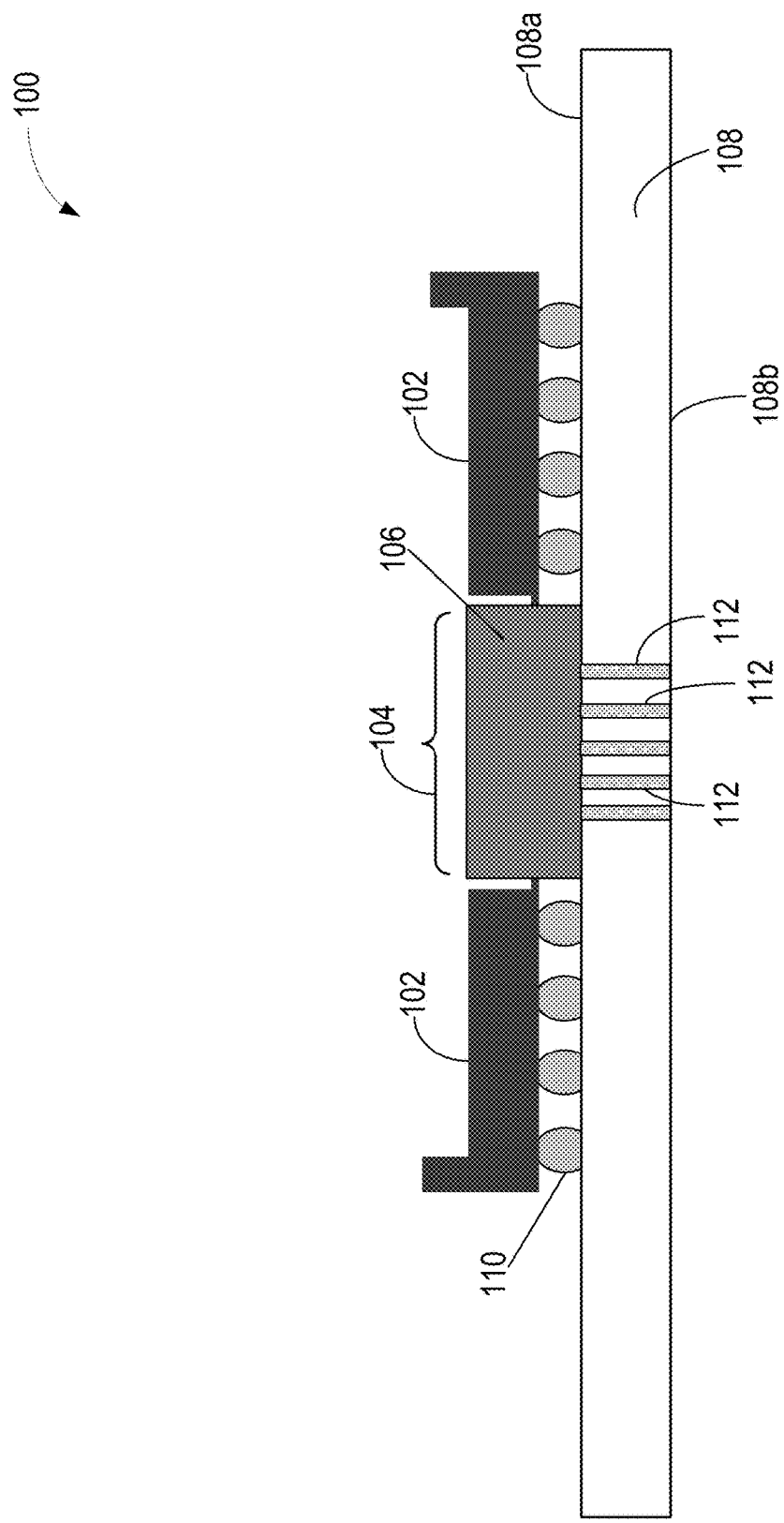
FIG. 1 illustrates an example IC package assembly that includes a socket with a thermal conductor coupled to a motherboard that includes thermally conductive vias, in accordance with some embodiments.

Embodiments of the present disclosure generally relate to a socket with a thermal conductor to receive a substrate package. In embodiments, the socket may include a first side to receive an IC package substrate, where the IC package substrate may include a heat source thermally coupled to the first side. The socket may include a second side to couple to a first side of a printed circuit board (PCB), and the second side may be thermally coupled to the first side of the PCB. The socket may include a thermal conductor to thermally couple an area of the first side of the socket to an area of the second side of the socket. In embodiments, the socket may include a cavity with the thermal conductor inserted within the cavity.

Dies within chips inserted into a socket, such as a central processor unit (CPU) package attached to a socket coupled with a motherboard, typically require cooling during operation. In legacy implementations, this cooling may include a heat sink thermally coupled to the top side of the die that is opposite the side closest to the motherboard to which the socket may be attached. For example, heat sinks with air cooling typically limits the maximum thermal design power of a CPU package to reach 300 watt (W) range in a normal size system. The thermal design power of CPU package is primarily transferred from die junction to an integrated heat spreader (IHS) thermally coupled to the die junction, and then to the heatsink/air. The use of Integrated Voltage Regulator (IVR) technology posts additional challenges to the thermal management of the CPU package. The Air Core Inductors (ACIs) of an IVR are designed inside package substrate layers. Most of the heat generated within ACIs also follows the same path to die and IHS.

Embodiments described herein may include an auxiliary heat transfer path to conduct heat from a CPU package seated in a socket to a surface of a PCB, such as a motherboard, opposite the side to which the socket is attached. This auxiliary heat transfer path may function in addition to a heat transfer path through the legacy die-IHS-heatsink path.

Embodiments described herein may include high thermal conductivity or highly compliant gap filler material placed inside a cavity within a socket. In embodiments, the thermal conductivity material may be proximate to a hot spot within a CPU package, such as a CPU die. In embodiments, a thermal via array inside the PCB to which the socket is attached, such as a motherboard, may be coupled to a heatsink such as a steel socket stiffener. In embodiments, the steel socket stiffener may include a design to increase strength and increase the area of heat transfer. In embodiments, there may be a perforated chassis wall area proximate to the socket stiffener plate to support heat dissipation to ambient air within the chassis as well as the outside of the chassis.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact. The term "integrated circuit (IC) package" may simply be referred to as "package."

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, FPGA, an electronic circuit, a combinational logic circuit, and/or other suitable components that provide the described functionality.

Various figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates an example IC package assembly that includes a socket with a thermal conductor coupled to a motherboard that includes thermally conductive vias, in accordance with some embodiments. Diagram 100 shows a socket 102 that may receive and couple with a package substrate, such as, but not limited to, a processor package that contains one or more processor chips. The socket 102 may include one or more holes 104 within the socket 102. Examples of such a socket may include but are not limited to sockets adhering to the Socket 7 or Socket 5 specification of Intel Corporation, Santa Clara, Calif., published June 1995 and March 1994, respectively.

In embodiments, the socket 102 may be physically coupled to a printed circuit board (PCB), for example a motherboard 108. In embodiments, the socket 102 may be physically or electrically coupled to a component other than a PCB; however, for ease of understanding, this component will be referred to as a motherboard 108. The socket 102 may be connected to the motherboard 108 using bumps 110. In embodiments, the bumps 110 may be implemented as solder balls. The coupling between the socket 102 and motherboard 108 may include an underfill layer. In alternate embodiments, the socket 102 may be joined with motherboard 108 using other packaging technologies.

In embodiments, the one or more holes 104 within the socket 102 may be filled with a thermally conductive material 106 that may allow thermal conductivity between a package substrate seated in the socket 102 and the motherboard 108. The thermally conductive material 106 may include a fiberglass-reinforced filler and/or polymer with a high thermal conductivity, a pad, a putty material, silicone material, or other suitable material. The thermally conductive material 106 may either completely or partially fill the hole 104. In embodiments, the thermally conductive material 106 may be formed around active or passive components (not shown) on the motherboard 108 that may be on the motherboard surface 108a proximate to the hole 104 in the socket 102.

In embodiments, the motherboard 108 may include one or more thermal vias 112 to thermally conduct heat from the thermally conductive material 106 to the motherboard side 108b opposite the socket 102. The thermal vias 112 may be created by drilling holes through the motherboard 108 and inserting copper, or some other thermally conductive material, into the drilled holes. In embodiments, the copper may be solid within the hole, or may have a constant or varied thickness through the hole. In embodiments, the top or bottom of the thermal vias 112 may couple with additional thermally conductive material on the sides 108a, 108b of the motherboard. In embodiments, the vias 112 may be implemented as, or referred to as thermal pathways.

In embodiments, the location and/or grouping of the vias 112 may be such that they are grouped in relation to the thermal connector 106 proximate to one or more heat sources within a package substrate seated in the socket 102. The grouping may facilitate more efficient heat transfer between the one or more heat sources to the motherboard side 108b opposite the socket 102

Figure 2:
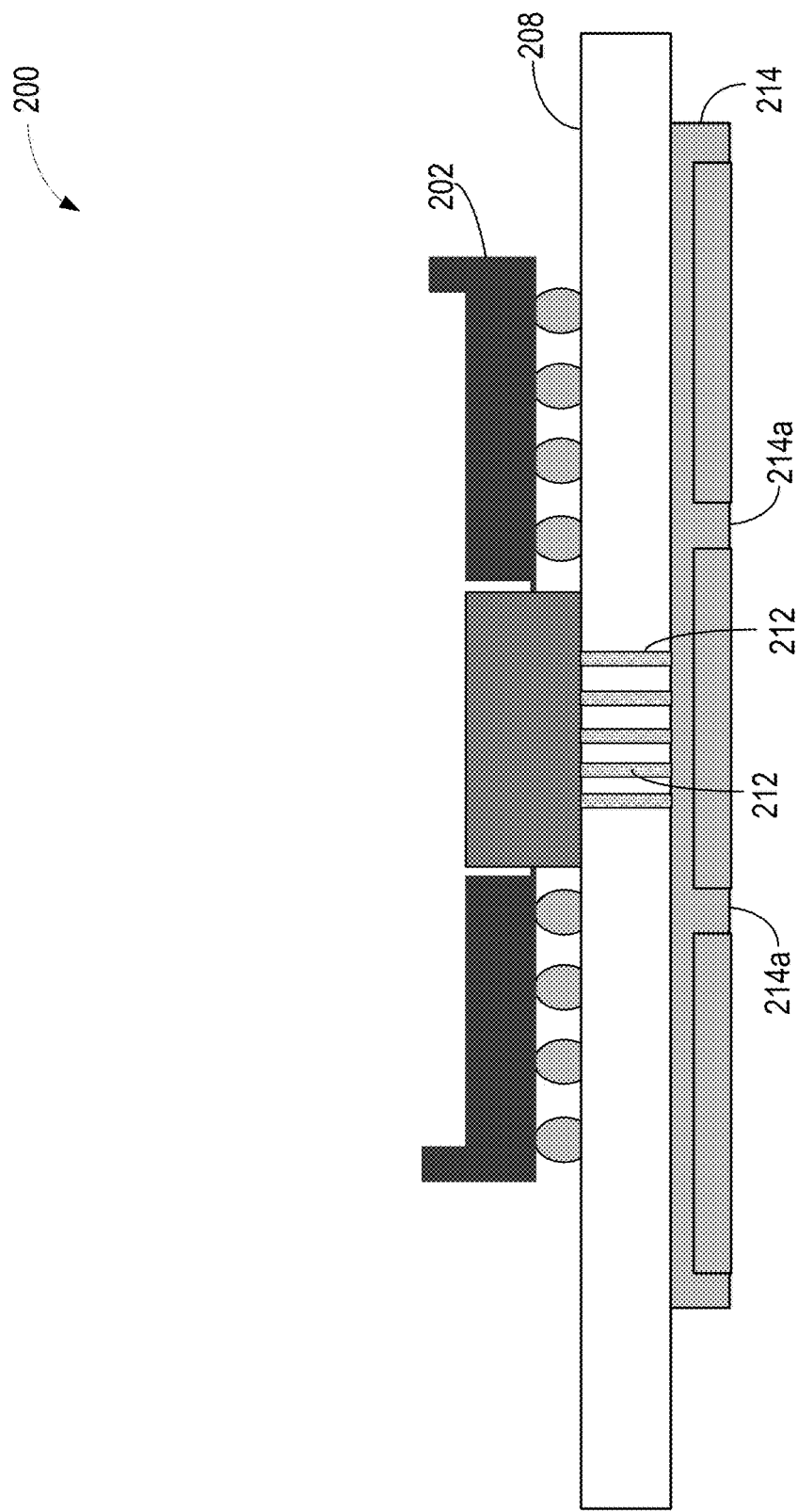
FIG. 2 illustrates an example assembly that includes a socket stiffener coupled with the motherboard, in accordance with some embodiments.

FIG. 2 illustrates an example IC package assembly that includes a socket stiffener coupled with the motherboard, in accordance with some embodiments. Diagram 200 shows a socket stiffener 214 that may be thermally and/or mechanically coupled to the motherboard 208, which may be similar to motherboard 108 of FIG. 1 or thermally and/or mechanically coupled to one or more vias 212, which may be similar to the one or more vias 112 of FIG. 1. Socket stiffener 214 may be a steel or other metallic socket stiffener that are thermally conductive.

In embodiments, the socket stiffener 214 may be any plate having thermally conductive properties that may dissipate heat from the one or more vias 212. The socket stiffener 214 may include ribs 214a to increase the strength of the motherboard 208 when a package substrate is seated into the socket 202, which may be similar to socket 102 of FIG. 1. The ribs 214a may decrease the deflection of the motherboard 208 during seating, or may provide increased heat transfer mass or increase heat dissipation into ambient air surrounding the steel socket stiffener 214.

Figure 3:
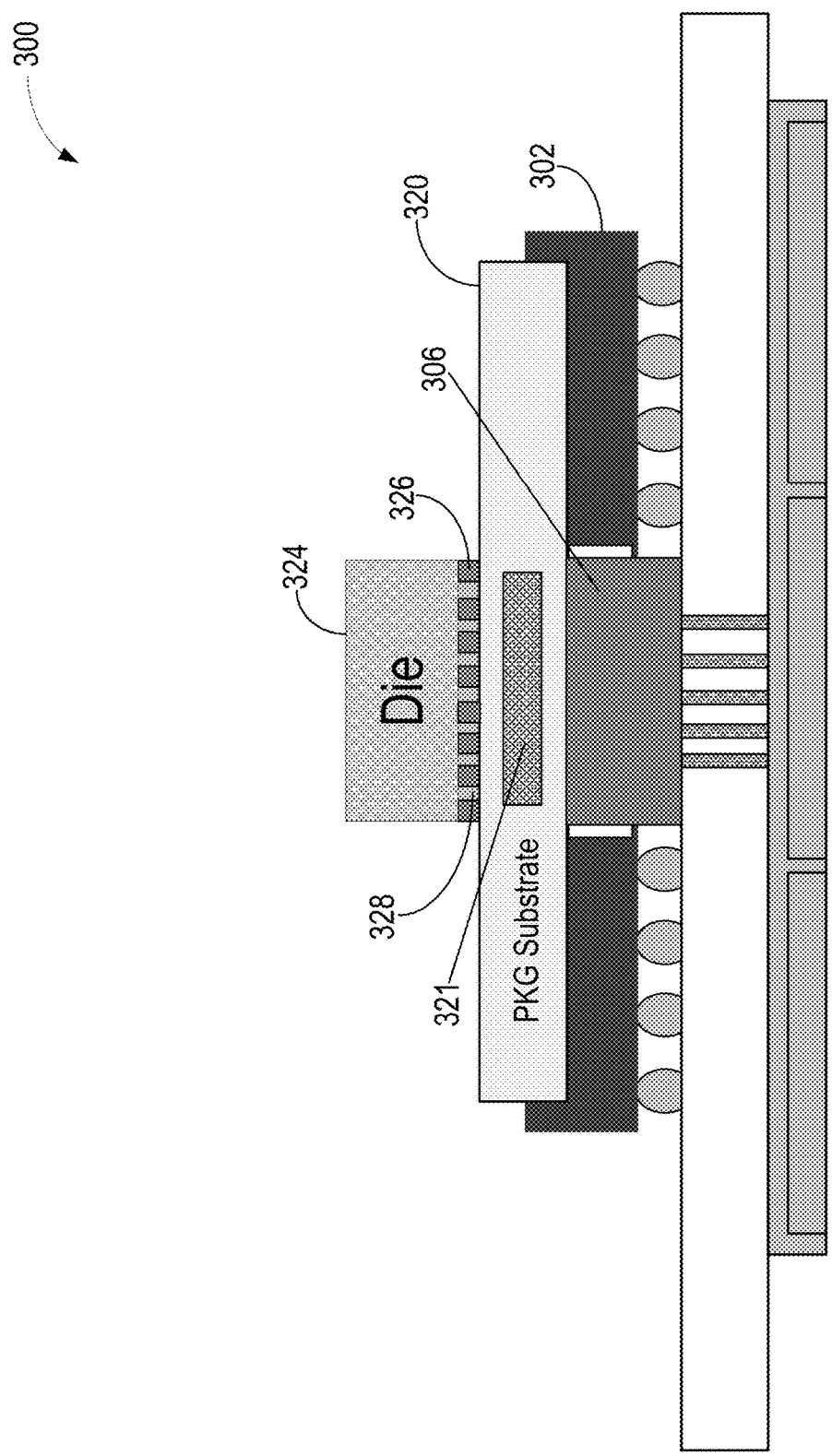
FIG. 3 illustrates an IC package assembly seated in the socket that includes a die, in accordance with some embodiments.

FIG. 3 illustrates an IC package assembly seated in the socket that includes a die, in accordance with some embodiments. Diagram 300 may show a package substrate 320 seated within a socket 302, which may be similar to socket 102 of FIG. 1. The package substrate 320 may include a die 324 that may be coupled with bumps 326. In embodiments, the bumps 326 may be controlled collapsed chip connection (C4) bumps, or some other suitable connection mechanism. The die 324 may include one or more CPU cores, graphics processor unit (GPU), read-only memory (ROM), random access memory (RAM), input-output (IO) logic, field programmable gate arrays (FPGA) or other component. During operation, the die 324 may generate heat to be dissipated. In embodiments, the die 324 may represent multiple dies. In embodiments, the substrate 320 may include one or more integrated voltage regulators (IVRs)/air core inductors (ACIs) 321 that may also generate heat to be dissipated.

In embodiments, and underfill material 328 may be used to thermally couple or physically couple the die 324 to the package substrate 320. In embodiments, the underfill material 328 may include a polymer or liquid that may encapsulate a portion of the surface of the die 324 and the portion of the surface of the package substrate 320.

In embodiments, the package substrate 320 may be seated and/or secured to the socket 302 so that the package may be thermally coupled to the thermally conductive material 306, which may be similar to the thermally conductive material 106 of FIG. 1. When seated into the socket 302, the package substrate 320 may be in direct physical contact with the thermally conductive material 306. In embodiments, the thermally conductive material 306 may also be an amalgamation of different types of material having thermally conductive properties, for example but not limited to layers that may have varying attributes. For example, the thermally conductive material 306 may include a flexible, compressible pad (not shown) to cause a direct physical contact between the thermally conductive material 306 and the package substrate 320 when seated in the socket 302. In embodiments the package substrate 320 may incorporate one or more dies 324 within a layer of the package substrate (not shown).

Figure 4:
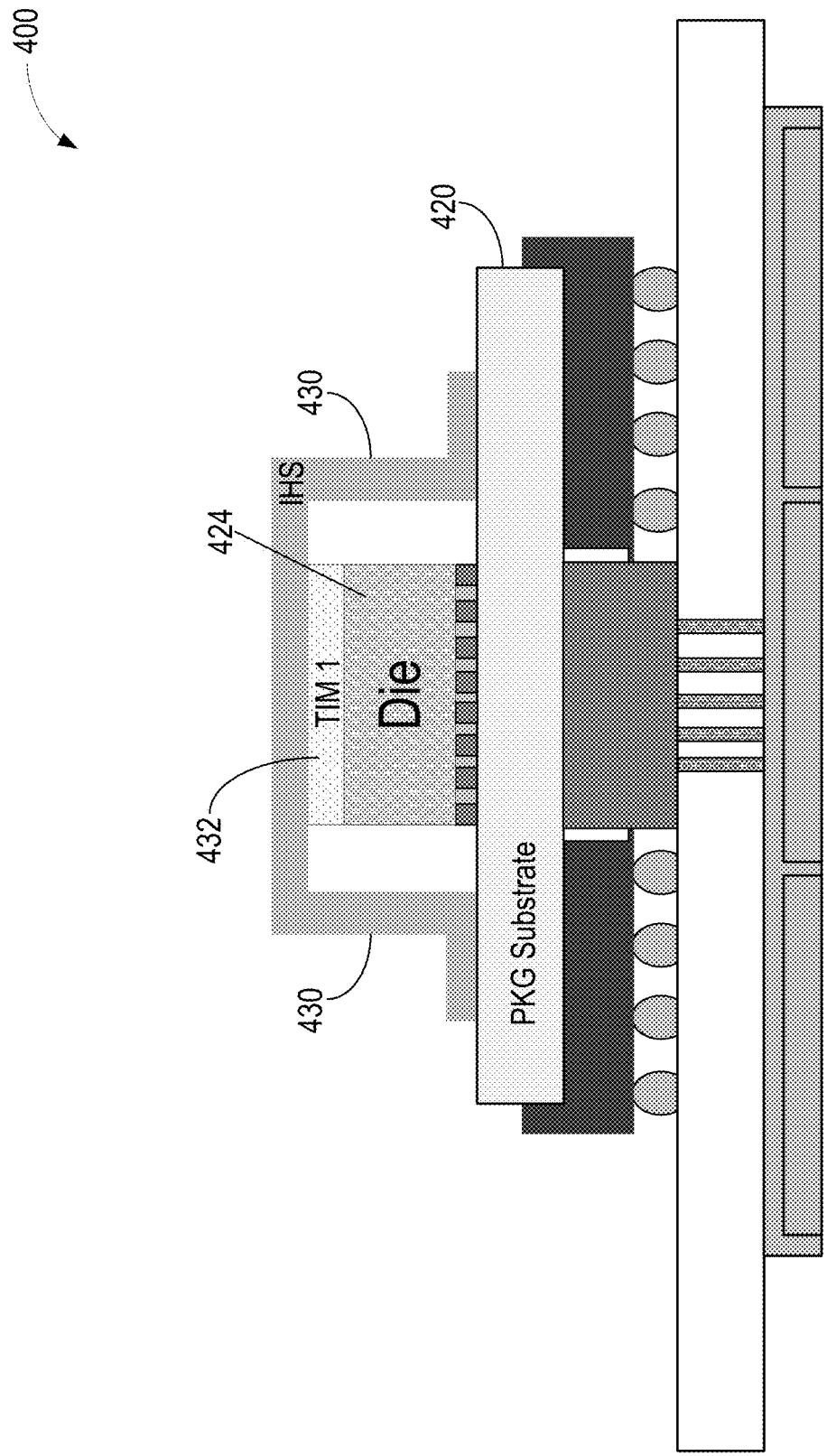
FIG. 4 illustrates an IC package assembly inserted into the socket that includes an integrated heat spreader (IHS), in accordance with some embodiments.

FIG. 4 illustrates an IC package assembly inserted into the socket that includes an integrated heat spreader (IHS), in accordance with some embodiments. Diagram 400 shows a package substrate 420, which may be similar to substrate 320 of FIG. 3, and a die 424, which may be similar to die 324 of FIG. 3, thermally coupled to an IHS 430. The IHS 430 may include a thermally conductive metal or some other thermally conductive substance used to route heat away from the package substrate 420 or the die 424. IHS 430 may be soldered or otherwise physically coupled to the package substrate 420. In embodiments, a thermal interface material (TIM) 432 may thermally couple the IHS 430 to the die 424. The TIM 432 may be inserted as shown to enhance the thermal coupling between the IHS 430 and the die 424. In embodiments of the TIM 432 may include thermal grease, thermal glue, thermal gap filler, a thermal pad, thermal adhesive, and/or thermal tape.

Figure 5:
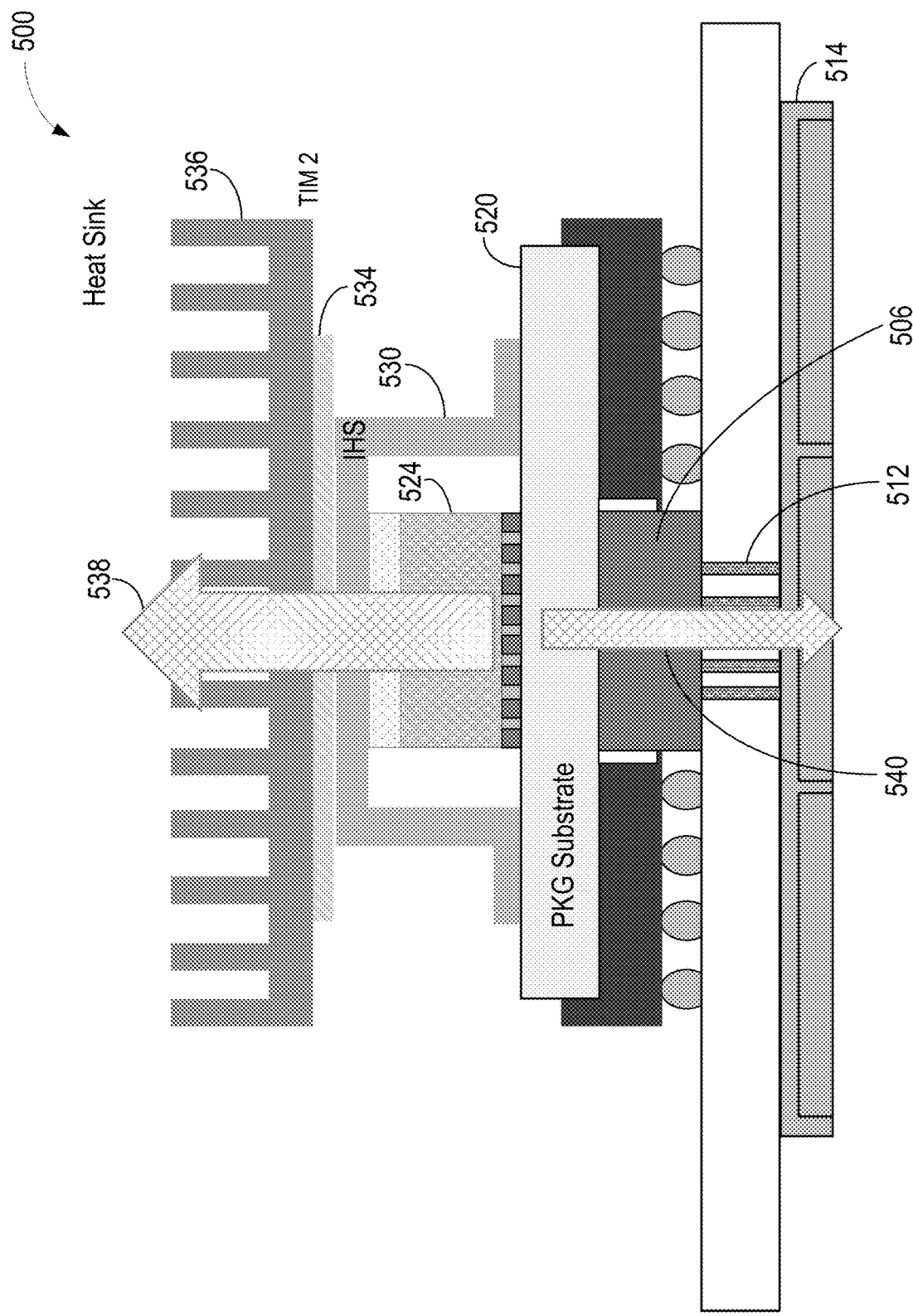
FIG. 5 illustrates an example IC package assembly that includes a heat sink coupled to the integrated heat spreader, in accordance with embodiments.

FIG. 5 illustrates an example IC package assembly that includes a heat sink coupled to the integrated heat spreader, in accordance with embodiments. Diagram 500 shows a heat sink 536 thermally coupled to the IHS 530, which may be similar to the IHS 430 of FIG. 4. The heat sink 536 may be exposed to ambient air (not shown) or may be exposed to a coolant (not shown) in a liquid or multi-phase form.

The heat sink 536 and the IHS 530 may be thermally coupled by a direct physical contact to a TIM 534. In embodiments, the TIM 534 may have a similar composition as described for the TIM 434 of FIG. 4.

In embodiments, heat generated by the package substrate 520, which may be similar to package substrate 420 of FIG. 4, or generated by the die 524, which may be similar to die 424 of FIG. 4, may flow in a first direction 538 toward the heat sink 536. The heat may also flow in a second direction 540, through the thermally conductive material 506, which may be similar to thermally conductive material 306 of FIG. 3, and through thermal vias 512, which may be similar to thermal vias 112 of FIG. 1, toward the steel socket stiffener 514, which may be similar to the steel socket stiffener 214 of FIG. 2. In embodiments, the steel socket stiffener 514 may be proximate to a perforated wall chassis (not shown) to facilitate heat transfer to ambient air within the room (not shown).

Figure 6:
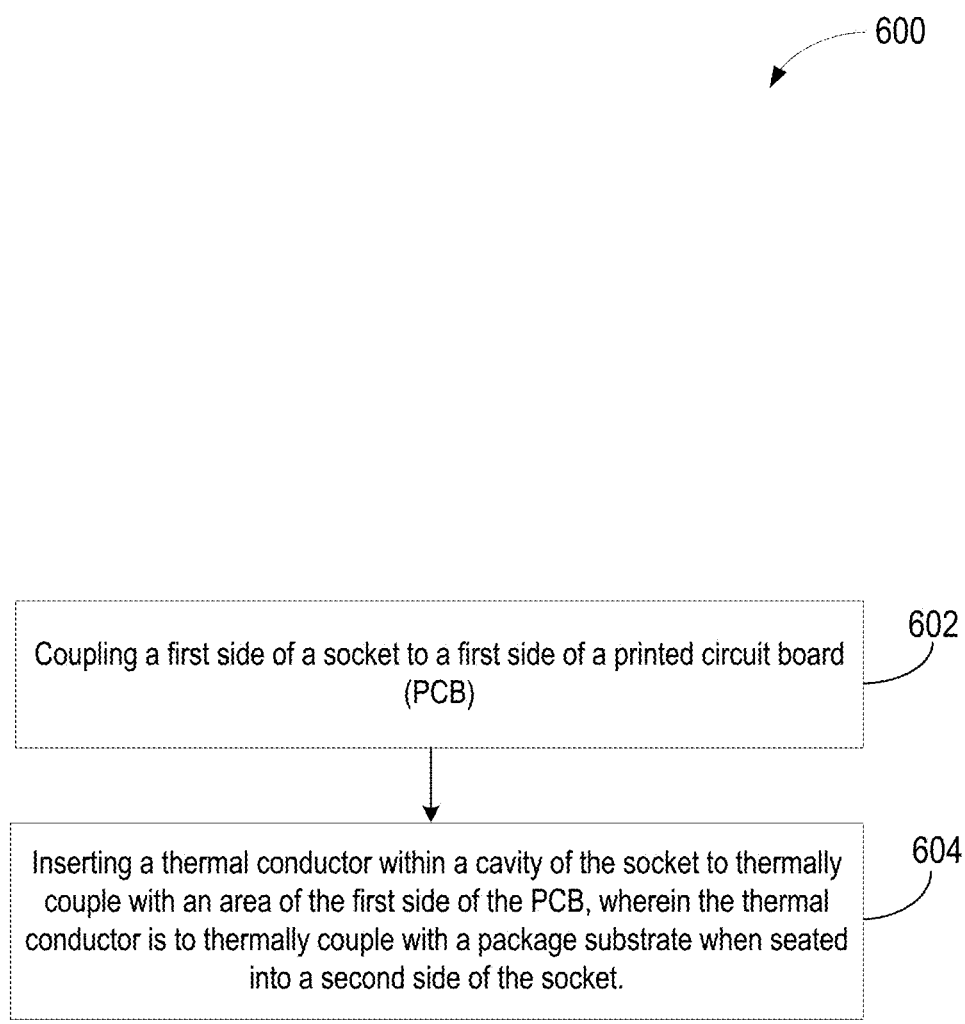
FIG. 6 illustrates an example flow diagram showing a process 700 for manufacturing a socket assembly to receive an IC package substrate coupled with a die, in accordance with embodiments.

FIG. 6 illustrates an example flow diagram showing a process 600 for manufacturing a socket assembly to receive a package substrate coupled with a die, in accordance with embodiments.

Block 602 may include coupling a first side of a socket to a first side of a PCB. In embodiments, the individual actions of block 602 may be indicated by the actions described in relation to FIG. 1. In embodiments, the socket may be similar to socket 102 of FIG. 1 or socket 302 of FIG. 3, and the PCB may be similar to motherboard 108 of FIG. 1. In embodiments, the socket 102 and the motherboard 108 may be coupled by solder balls 110. The coupling may include underfill (not shown), or some other suitable coupling material. In embodiments, the coupling may include electrical coupling in addition to a physical coupling.

Block 604 may include inserting a thermal conductor within a cavity of the socket to thermally couple with an area of the first side of the PCB, wherein the thermal conductor is to thermally couple with a package substrate when seated into a second side of the socket. In embodiments, the cavity of the socket may be similar to cavity 104 of FIG. 1 of socket 102. The thermal conductor may be similar to the thermal conductor 106 of FIG. 1 or thermal conductor 306 of FIG. 3, and the first side of the PCB may be similar to side 108a of motherboard 108 of FIG. 1. As described above, the thermal conductor 106 may be made of a number of different materials, having various form factors, which may allow heat to be conducted through the cavity 104 of the socket 102 to the motherboard 108. The package substrate may be similar to package substrate 320 of FIG. 3. The thermal conductor 306 may be thermally coupled to the package substrate 320 when the package is seated in the socket 302.

Figure 7:
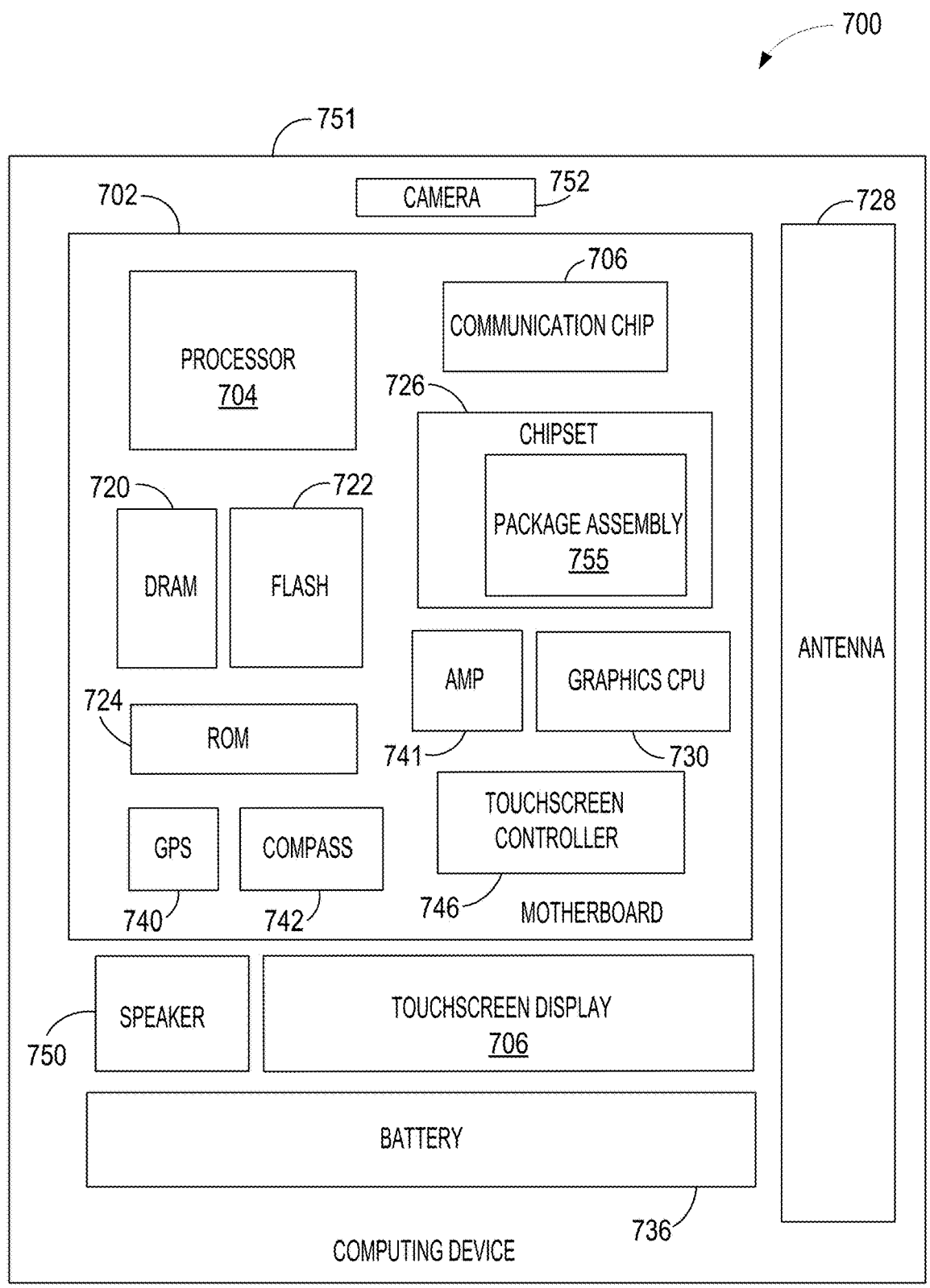
FIG. 7 schematically illustrates a computing device, in accordance with embodiments.

FIG. 7 schematically illustrates a computing device, in accordance with embodiments.

Embodiments of the present disclosure may be implemented into a system using any suitable hardware and/or software to configure as desired. FIG. 7 schematically illustrates a computing device 700 in accordance with one embodiment. The computing device 700 may house a board such as motherboard 702 (i.e. housing 751). The motherboard 702 may include a number of components, including but not limited to a processor 704 and at least one communication chip 706. The processor 704 may be physically and electrically coupled to the motherboard 706, for example as described in relation to FIGS. 1-6. In some implementations, the at least one communication chip 706 may also be physically and electrically coupled to the motherboard 702, for example as described in relation to FIGS. 1-6.

Depending on its applications, computing device 700 may include other components that may or may not be physically and electrically coupled to the motherboard 702. These other components may include, but are not limited to, volatile memory (e.g., DRAM) 720, non-volatile memory (e.g., ROM) 724, flash memory 722, a graphics processor 730, a digital signal processor (not shown), a crypto processor (not shown), a chipset 726, an antenna 728, a display (not shown), a touchscreen display 732, a touchscreen controller 746, a battery 736, an audio codec (not shown), a video codec (not shown), a power amplifier 741, a global positioning system (GPS) device 740, a compass 742, an accelerometer (not shown), a gyroscope (not shown), a speaker 750, a camera 752, and a mass storage device (such as hard disk drive, compact disk (CD), digital versatile disk (DVD), and so forth) (not shown). Further components, not shown in FIG. 6, may include a microphone, a filter, an oscillator, a pressure sensor, or an RFID chip. In embodiments, one or more of the package assembly components 755 may be a die such as die 324 or a package substrate 320 of FIG. 3.

The communication chip 706 may enable wireless communications for the transfer of data to and from the computing device 700. The term "wireless" and its derivatives may be used to describe circuits, devices, systems, processes, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 706 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 706 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, laser communications, photonics communications and others.

The processor 704 of the computing device 700 may include a die in a package assembly such as, for example, one of package assemblies of diagrams 300, 400, or 500 described herein. The term "processor" may refer to any device or portion of a device that processes electronic data from registers and/or memory to transform that electronic data into other electronic data that may be stored in registers and/or memory.

In various implementations, the computing device 700 may be a laptop, a netbook, a notebook, an Ultrabook™, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data, for example an all-in-one device such as an all-in-one fax or printing device.

EXAMPLES

The following paragraphs describe examples of various embodiments:

Example 1 may be an apparatus, comprising: a socket that includes: a first side to receive a package substrate, wherein the package substrate includes a heat source thermally coupled to the first side; a second side to couple to a first side of a printed circuit board (PCB), the second side being thermally coupled to the first side of the PCB; and a thermal conductor to thermally couple an area of the first side of the socket to an area of the second side of the socket.

Example 2 may include the apparatus of example 1, or of any other example herein, wherein the socket further includes a cavity, and the thermal conductor is inserted within the cavity.

Example 3 may include the apparatus of example 2, or of any other example herein, wherein the thermal conductor substantially fills the cavity in the socket.

Example 4 may include the apparatus of example 3, or of any other example herein, wherein the thermal conductor is to directly thermally couple the package substrate and the PCB.

Example 5 may include the apparatus of example 1, or of any other example herein, wherein the thermal conductor comprises a thermally conductive gap filling material.

Example 6 may include the apparatus of example 1, or of any other example herein, wherein the area of the first side of the socket is proximate to the heat source of the package substrate.

Example 7 may include the apparatus of any one of examples 1-6, or of any other example herein, wherein the apparatus includes the PCB.

Example 8 may include the apparatus of the example 7, or of any other example herein, wherein the PCB includes one or more PCB thermal conductors to directly thermally couple the socket thermal conductor to a second side of the PCB.

Example 9 may include the apparatus of example 8, or of any other example herein, wherein the one or more PCB thermal conductors are thermal vias.

Example 10 may include the apparatus of example 8, or of any other example herein, wherein the second side of the PCB is to thermally couple to a heat sink.

Example 11 may include the apparatus of example 10, or of any other example herein, wherein the heat sink comprises a socket stiffener.

Example 12 may include the apparatus of example 11, or of any other example herein, wherein the socket stiffener is a steel socket stiffener.

Example 13 may include the apparatus of example 11, or of any other example herein, wherein the socket stiffener includes one or more ribs to increase strength and thermal dissipation.

Example 14 may include the apparatus of example 7, or of any other example herein, wherein the heat source comprises a die.

Example 15 may include the apparatus of example 7, or of any other example herein, wherein the heat source comprises a processor die.

Example 16 may be a method, comprising: coupling a first side of a socket to a first side of a printed circuit board (PCB); and inserting a thermal conductor within a cavity of the socket to thermally couple with an area of the first side of the PCB, wherein the thermal conductor is to thermally couple with a package substrate when seated into a second side of the socket.

Example 17 may include the method of example 16, or of any other example herein, wherein the thermal conductor is to directly physically couple with the package substrate when seated into the second side of the socket.

Example 18 may include the method of example 17, or of any other example herein, further comprising creating one or more thermal pathways from the first side of the PCB to the second side of the PCB to directly thermally couple the socket thermal conductor to a second side of the PCB.

Example 19 may include the method of example 18, or of any other example herein, wherein the one or more PCB thermal pathways are thermal vias.

Example 20 may include the method of any one of examples 16-19, or of any other example herein, further comprising coupling a heat sink to the second side of the PCB to thermally couple with the thermal conductor.

Example 21 may include the method of any one of examples 16-19, or of any other example herein, wherein the thermal conductor substantially fills the cavity in the socket.

Example 22 may include the method of any one of examples 16-19, or of any other example herein, wherein the thermal conductor is to directly thermally couple the package substrate and the PCB.

Example 23 may include the method of any one of examples 16-19, or of any other example herein, wherein the thermal conductor comprises a thermally conductive gap filling material.

Example 24 may include the method of any one of examples 16-19, or of any other example herein, wherein the heat sink comprises a socket stiffener.

Example 24.5 may include the method of example 24, or of any other example herein, wherein the socket stiffener is a steel socket stiffener.

Example 25 may be an apparatus comprising: means for coupling a first side of a socket to a first side of a printed circuit board (PCB); and means for inserting a thermal conductor within a cavity of the socket to thermally couple with an area of the first side of the PCB, wherein the thermal conductor is to thermally couple with a package substrate when seated into a second side of the socket.

Example 26 may include the apparatus of example 25, or of any other example herein, wherein the thermal conductor is to directly physically couple with the package substrate when seated into the second side of the socket.

Example 27 may include the apparatus of example 25, or of any other example herein, wherein the thermal conductor substantially fills the cavity in the socket.

Example 28 may include the apparatus of example 25, or of any other example herein, wherein the thermal conductor is to directly thermally couple the package substrate and the PCB.

Example 29 may include the apparatus of example 25, or of any other example herein, wherein the thermal conductor comprises a thermally conductive gap filling material.

Example 30 may include the apparatus of example 26, or of any other example herein, further comprising means for creating one or more thermal pathways from the first side of the PCB to the second side of the PCB to directly thermally couple the socket thermal conductor to a second side of the PCB.

Example 31 may include the apparatus of example 30, or of any other example herein, wherein the one or more PCB thermal pathways are thermal vias.

Example 32 may include the method of any one of examples 25-31, or of any other example herein, further comprising coupling a heat sink to the second side of the PCB to thermally couple with the thermal conductor.

Example 33 may include the method of example 32, or of any other example herein, wherein the heat sink comprises a steel socket stiffener.

Example 34 may be a system, comprising: a package substrate with a first side and a second side; a heat source thermally coupled to the first side of the package substrate; a printed circuit board (PCB) with a first side and a second side; a socket that includes: a first side to receive a package substrate, wherein the package substrate includes a heat source thermally coupled to the first side; a second side to couple to a first side of a printed circuit board (PCB), the second side being thermally coupled to the first side of the PCB; and a thermal conductor to thermally couple an area of the first side of the socket to an area of the second side of the socket.

Example 35 may include the system of example 34, or of any other example herein, wherein the socket further includes a cavity, and the thermal conductor is inserted within the cavity.

Example 36 may include the system of example 35, or of any other example herein, wherein the thermal conductor substantially fills the cavity in the socket.

Example 37 may include the system of example 36, or of any other example herein, wherein the thermal conductor is to directly thermally couple the package substrate and the PCB.

Example 38 may include the system of example 35, or of any other example herein, wherein the thermal conductor comprises a thermally conductive gap filling material.

Example 39 may include the system of example 35, or of any other example herein, wherein the area of the first side of the socket is proximate to the heat source of the package substrate.

Example 40 may include the system of any one of examples 35-39, or of any other example herein, wherein the system includes the PCB.

Example 41 may include the system of example 40, or of any other example herein, wherein the PCB includes one or more PCB thermal conductors to directly thermally couple the socket thermal conductor to a second side of the PCB.

Example 42 may include the system of example 41, or of any other example herein, wherein the one or more PCB thermal conductors are thermal vias.

Example 43 may include the system of example 41, or of any other example herein, wherein the second side of the PCB is to thermally couple to a heat sink.

Example 44 may include the system of example 43, or of any other example herein, wherein the heat sink comprises a socket stiffener.

Example 45 may include the system of example 44, or of any other example herein, wherein the socket stiffener is a steel socket stiffener.

Example 46 may include the system of example 44, or of any other example herein, wherein the socket stiffener includes one or more ribs to increase strength and thermal dissipation.

Example 47 may include the system of example 40, or of any other example herein, wherein the heat source comprises a die.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus, comprising:
a socket that includes:
a first side to receive a package substrate, wherein the package substrate includes a heat source thermally coupled to the first side;
a second side of the socket opposite the first side of the socket, the second side of the socket in contact with a first side of a printed circuit board (PCB); and
a thermal conductor proximate to the heat source, the thermal conductor extending from the first side of the socket to the first side of the PCB, the thermal conductor thermally coupled with one or more thermal conductors extending from the first side of the PCB to a second side of the PCB opposite the first side of the PCB.

2. The apparatus of claim 1, wherein the socket further includes a cavity, and the thermal conductor is inserted within the cavity.

3. The apparatus of claim 2, wherein the thermal conductor substantially fills the cavity in the socket.

4. The apparatus of claim 3, wherein the thermal conductor is to directly thermally couple the package substrate and the PCB.

5. The apparatus of claim 1, wherein the thermal conductor comprises a thermally conductive gap filling material.

6. The apparatus of claim 1, wherein the area of the first side of the socket is proximate to the heat source of the package substrate.

7. The apparatus of claim 1, wherein the one or more PCB thermal conductors are thermal vias.

8. The apparatus of claim 1, wherein the second side of the PCB is to thermally couple to a heat sink.

9. The apparatus of claim 8, wherein the heat sink comprises a socket stiffener.

10. The apparatus of claim 9, wherein the socket stiffener is a steel socket stiffener.

11. The apparatus of claim 9, wherein the socket stiffener includes one or more ribs to increase strength and thermal dissipation.

12. The apparatus of claim 1, wherein the heat source comprises a processor die or an air core inductor.

13. A system, comprising:
a package substrate with a first side and a second side opposite the first side;
a heat source thermally coupled to the first side of the package substrate;
a printed circuit board (PCB) with a first side and a second side opposite the first side;
a socket that includes:
a first side of the socket coupled with the second side of the package substrate;
a second side of the socket opposite the first side of the socket, the second side of the socket in contact with a first side of the PCB; and
a thermal conductor to thermally couple an area of the second side of the package substrate underneath the heat source to an area of the first side of the PCB; and
wherein the PCB includes one or more thermal vias extending from the area of the first side of the PCB to a second side of the PCB opposite the first side of the PCB.

14. The system of claim 13, wherein the socket further includes a cavity, and wherein the thermal conductor is inserted within the cavity.

15. The system of claim 14, wherein the thermal conductor comprises a thermally conductive gap filling material.

16. The system of claim 13, further comprising an integrated heat spreader (IHS) coupled with the first side of the package substrate and surrounding the heat source, wherein the IHS is thermally coupled with the heat source.

17. The system of claim 16, wherein the heat source includes one or more dies.

18. The system of claim 13, further comprising a thermal plate coupled with the second side of the PCB and thermally coupled with the one or more thermal vias.

* * * * *